(12) United States Patent
Pahl

(10) Patent No.: US 10,542,630 B2
(45) Date of Patent: Jan. 21, 2020

(54) HOUSING FOR AN ELECTRIC COMPONENT, AND METHOD FOR PRODUCING A HOUSING FOR AN ELECTRIC COMPONENT

(71) Applicant: EPCOS AG, Munich (DE)

(72) Inventor: Wolfgang Pahl, Munich (DE)

(73) Assignee: TDK Corporation, Munich (DE)

( * ) Notice: Subject to any disclaimer, the term of this patent is extended or adjusted under 35 U.S.C. 154(b) by 0 days.

(21) Appl. No.: 15/322,089

(22) PCT Filed: Jun. 22, 2015

(86) PCT No.: PCT/EP2015/063969
§ 371 (c)(1),
(2) Date: Dec. 23, 2016

(87) PCT Pub. No.: WO2015/197551
PCT Pub. Date: Dec. 30, 2015

(65) Prior Publication Data
US 2017/0135240 A1    May 11, 2017

(30) Foreign Application Priority Data
Jun. 23, 2014  (DE) .................. 10 2014 108 741

(51) Int. Cl.
*H05K 5/00* (2006.01)
*H05K 5/06* (2006.01)

(52) U.S. Cl.
CPC ........... *H05K 5/069* (2013.01); *H05K 5/0095* (2013.01)

(58) Field of Classification Search
CPC ..... H05K 9/0032; H05K 1/0218; G06F 1/182
See application file for complete search history.

(56) References Cited

U.S. PATENT DOCUMENTS

| 4,477,828 | A  |   | 10/1984 | Scherer |  |
|---|---|---|---|---|---|
| 5,886,876 | A  | * | 3/1999 | Yamaguchi | ........... H01L 23/055 174/255 |
| 6,377,475 | B1 | * | 4/2002 | Reis | ........... H05K 9/003 174/387 |
| 7,552,532 | B2 |   | 6/2009 | Stelzl et al. |  |
| 7,999,196 | B2 | * | 8/2011 | Hsieh | ........... H05K 9/0045 174/386 |
| 8,169,041 | B2 |   | 5/2012 | Pahl et al. |  |

(Continued)

FOREIGN PATENT DOCUMENTS

| DE | 102005053765 A1 | 5/2007 |
|---|---|---|
| DE | 102011112476 A1 | 3/2013 |

(Continued)

OTHER PUBLICATIONS

JPH 0327553 English Translation.*
DE 4021579 A1 English Translation, published on Jan 16, 1992 (Year: 1992).*

*Primary Examiner* — Pete T Lee

(57) ABSTRACT

A housing for an electric component and a method for producing a housing for an electric component are disclosed. In an embodiment the housing includes a first housing part and a second housing part, wherein the first housing part is connected to the second housing part in a joining region, and wherein the joining region is at least partially covered by a coating containing sprayed-on particles.

16 Claims, 8 Drawing Sheets

(56) References Cited

U.S. PATENT DOCUMENTS

| | | | |
|---|---|---|---|
| 8,432,007 B2 | 4/2013 | Leidl et al. | |
| 9,006,868 B2 | 4/2015 | Bauer et al. | |
| 2001/0033478 A1 | 10/2001 | Ortiz et al. | |
| 2004/0046245 A1* | 3/2004 | Minervini | B81B 7/0064 |
| | | | 257/704 |
| 2006/0151203 A1* | 7/2006 | Krueger | H03H 9/0557 |
| | | | 174/260 |
| 2006/0162157 A1 | 7/2006 | Schimetta et al. | |
| 2009/0001553 A1* | 1/2009 | Pahl | B81B 7/0064 |
| | | | 257/704 |
| 2014/0226285 A1 | 8/2014 | Bauer et al. | |

FOREIGN PATENT DOCUMENTS

| | | |
|---|---|---|
| JP | S54114569 U | 8/1979 |
| JP | H03027553 A | 2/1991 |
| JP | 2006510235 A | 3/2006 |
| JP | 2009514691 A | 4/2009 |
| JP | 2014502563 A | 2/2014 |
| WO | 03012856 A2 | 2/2003 |
| WO | 2005001934 A2 | 1/2005 |
| WO | 2012089408 A1 | 7/2012 |

\* cited by examiner

HOUSING FOR AN ELECTRIC COMPONENT, AND METHOD FOR PRODUCING A HOUSING FOR AN ELECTRIC COMPONENT

This patent application is a national phase filing under section 371 of PCT/EP2015/063969, filed Jun. 22, 2015, which claims the priority of German patent application 10 2014 108 741.0, filed Jun. 23, 2014, each of which is incorporated herein by reference in its entirety.

TECHNICAL FIELD

A housing for an electric component, and a method for producing a housing for an electric component are specified.

BACKGROUND

Many electric components require a hermetic encapsulation in order to ensure their operation and reliability. This is realized, for example, by housing the component within a cavity which is formed, for example, by a trough-shaped substrate with a flat cover, a flat substrate with a trough-shaped cap or a trough-shaped substrate with a trough-shaped cap. Customary methods for connecting substrate and cover are based on metallic soldering or organic adhesives as connecting means. The connection comes about here by melting and resolidification or by thermally initiated polymerization.

However, the joining methods throw up a surprisingly persistent problem. Both solders and adhesives are viscous during processing and even in this state separate off the internal volume from the environment. In conjunction with the temperature profile, during the closing process pressure differences arise between internal volume and environment, which pressure differences can lift the cover or cause same to slip. A further possible consequence is flowing of the viscous connecting means because of this pressure, or a formation of channels because of a rupture in the interior at positive pressure and consequent leakages. Up to now, the problem has been countered, for example, by the covers being secured with weights or clamps, which is very complicated in particular in the case of a large number of parts.

SUMMARY OF THE INVENTION

Embodiments of the invention provide improved housing for an electric component and an improved production method for a housing.

According to a first aspect of the present invention, a housing for an electric component is specified. The housing is designed, for example, for accommodating a semiconductor chip, MEMS chip, SAW chip or BAW chip and/or passive components. In particular, the housing has a cavity for accommodating the component.

The housing has a first housing part and a second housing part. For example, the first housing part is designed as a cap, in particular as an arched cap. Alternatively, the first housing part is designed, for example, as a cover, in particular as a flat cover. The second housing part is formed, for example, by a substrate, in particular by a multi-layer substrate. In addition to the first and second housing part, the housing can also have further housing parts.

The first housing part is connected to the second housing part in a joining region. The joining region is preferably sealed in an air-tight manner, in particular in a hermetically tight manner. The entire housing is preferably sealed in a hermetically tight manner. The joining region is at least partially covered by a coating which has sprayed-on particles. In particular, the coating is formed by the sprayed-on particles.

The coating is preferably applied by deposition of a directed stream of particles. The particles are directed here onto the surface to be coated, i.e., the joining region. Owing to the kinetic and thermal energy of the particles, good adhesion and a dense layer can be ensured.

During a deposition of particles, the thickness of the coating can be slowly increased. A mechanical connection of the housing parts by the coating is successively built up and the gas exchange between the interior space and the outside is gradually suppressed. By means of these opposed operations, temperature influences can have only a slight disadvantageous effect, if any at all, during the application of the coating since, although the coating in the initial phase is still hardly able to withstand mechanical loads, no significant difference in pressure can come about at this time because of the high porosity. Although a significant internal pressure can build up as the coating thickness increases, the layer is, however, stable enough to hold the housing parts together in a precisely fitting manner.

In one embodiment, the coating is produced by thermal coating, in particular by a thermal spraying method. In this case, for example, particles are directed onto the joining region in a stream of carrier gas. The particles have, for example, sizes within the range of a few 10 nm to a few 10 µm. Use can be made, for example, of electric arc spraying, flame spraying, in particular high speed flame spraying, plasma spraying, laser spraying and cold gas spraying. All of these methods have great application rates and can be used under atmospheric conditions, which makes them highly economical. The methods differ in the thermal loading of the housing parts, for example, of a substrate. For applications in microelectronics, the last three methods mentioned can be used particularly readily.

In addition, there are related methods, for example, aerosol jet and maskless mesoscale metal deposition (M3D), in which precursor solutions or suspensions of the material to be deposited are atomized and directed as a focused gas jet onto the surface. However, after treatment, for example, tempering or in-line laser sintering, may be required there. These methods permit a particularly good geometrical resolution.

The deposition area extends from the sub mm into the cm range, depending on the method. In order to produce an extended coating, a scanning deposition can take place, for example. The particle jet source, for example, a nozzle, is moved here to and fro relative to the substrate. In this manner, a homogeneous layer can be produced over a large area or individual structural member contours can be provided with a coating in a specific manner. This may include repetitive processing patterns. In this manner, even extended housing arrangements, for example, an extended substrate, on which a multiplicity of individual structural members having respective housings are arranged and are jointly processed via a plurality of manufacturing steps, can be provided with a coating.

In one embodiment, the coating is electrically conductive. For example, the coating contains a metal. Metallic coatings can be particularly advantageous because of the required properties such as ductility, resistance, tightness and electrical conductivity. Copper and/or tin, for example, is/are used as the material for the coating.

The coating can also have a mixture of different materials. For example, the coating has a plurality of different metals, for example, copper and tin. After the metals are sprayed on, tempering can also take place in order to bring about, for example, a solid-liquid interdiffusion.

Both the first housing part and the second housing part are preferably at least partially covered by the coating. In particular, the housing parts are covered by the coating around the joining region. The coating is preferably present merely on an upper side of the housing parts, i.e., on regions of the housing parts that are accessible from the outside during the spraying-on process. The coating is preferably not present in the cavity of the housing and not in a gap between the housing parts, if the gap is not accessible during the spraying-on process.

In one embodiment, the entire upper side of the first housing part is provided with the coating. For example, better sealing of the housing can take place as a result, in particular if the first housing part is not air-tight per se. As an alternative or in addition thereto, shielding can take place by means of the coating applied over the entire surface area.

In one embodiment, the first housing part is formed from an electrically insulating material. For example, the first housing part contains a polymer material or is composed of a polymer material. Particularly in this case, it is advantageous if the entire upper side of the first housing part is provided with the coating.

In one embodiment, the housing has an electric contact. The electric contact is provided, for example, for contacting the first housing part. For example, the contact is arranged on or in the second housing part, in particular a substrate. The contact is connected, for example, to ground. The first housing part can thereby be connected to ground, in particular in order to obtain shielding. Alternatively or additionally, the coating can be used for shielding. The first housing part can be electrically connected to the electric contact by a conductive coating. In one embodiment, the contact is designed as a via, i.e., a through-hole connection.

In one embodiment, the coating is in direct electrical connection with the electric contact. For example, the contact projects beyond the outline of the first housing part. In particular, the contact projects out of the joining region. In this case, the coating can be at least partially directly applied to the contact.

In one embodiment, the coating is only in indirect electrical connection with the electric contact. For example, a further adhesive agent, for example, a conductive adhesive or a solder, is applied to the contact. The coating can be in direct electric contact with the adhesive agent such that there is an indirect electrical connection with the electric contact.

In one embodiment, an adhesive agent for producing a mechanical connection of the housing parts is additionally provided. For example, the adhesive agent is present only at individual spots of the joining region, for example, in a pointwise manner. The adhesive agent is arranged, for example, in the joining region at individual spots between the first housing part and the second housing part. In particular, the joining region has at least one spot in which there is no adhesive agent. Overall it is intended to be ensured that the adhesive agent does not produce a tight connection of the housing parts, and therefore pressure equalization can still take place via the joining region when the coating is applied.

The housing parts are preferably secured relative to one another by the adhesive agent, at least until the coating is applied. The adhesive agent can therefore serve for securing the position of the housing parts during the application of the coating. The adhesive agent can additionally also serve for further reinforcement of the mechanical connection when the coating has already been applied. For example, the adhesive agent can be at least partially covered by the coating.

The adhesive agent can be electrically conductive. For example, solder or an electric conductive adhesive is used as the adhesive agent. In this case, an electrical connection of the first housing part with an electric contact can be produced via the adhesive agent. Alternatively, the adhesive agent can be electrically insulating.

In one embodiment, apart from the coating, the housing is free from an adhesive agent for securing the housing parts, in particular is free from solder or conductive adhesive. In particular, the housing is free from an adhesive agent in the joining region of the housing parts.

In one embodiment, the first housing part is at least partially recessed in the second housing part. This can contribute to securing the position of the housing parts. In one embodiment, the housing parts are formed and arranged in an interlocking manner such that no further adhesive agent is required for securing the position during the application of the coating.

According to a further aspect of the present invention, a housing arrangement is specified. The housing arrangement has at least one housing, as described above, and at least one further housing part. For example, the first housing part forms a housing with the second housing part, and the second housing part forms a further housing with the further housing part. The first and the further housing part can have the same geometry, for example, can be designed as caps.

For example, the housing arrangement therefore comprises two cavities, which are separate from each other, for accommodating electric components. For example, the second housing part is designed as a substrate in which a plurality of structural member regions are provided. Each structural member region can comprise one or more electric components and can be sealed by a first or further housing part. For example, the structural members are processed jointly on a common substrate by a plurality of manufacturing steps and are then separated.

In particular, the housing arrangement can comprise a plurality of joining regions between different housing parts. In particular, there can be a joining region between the first and the second housing part and a further joining region between the further and the second housing part. The joining regions can be provided with a coating, as described above. The coating can be formed together for the two joining regions or can be present separately.

In one embodiment, the housing arrangement comprises at least one electric contact which, as described above, is designed, for example, for contacting the first and/or further housing part. A common electric contact for the first and further housing part can also be formed. When the housings are separated, the common electric contact is separated while retaining its function.

According to a further aspect of the present invention, a structural member comprising a housing as described above is specified. The structural member has at least one electric component which is arranged in the housing. For example, the electric component is designed as a semiconductor chip, SAW chip, BAW chip or MEMS chip and/or passive component. In particular, it can be an electronic component.

In addition, a structural member arrangement comprising a plurality of electric components is specified. In the case of the structural member arrangement, a plurality of electric components is accommodated in the housing arrangement described above.

According to a further aspect of the present invention, a method for producing a housing for an electric component is specified.

A first and a second housing part are joined to each other here in a joining region. Joining to each other can merely mean placing one of the housing parts onto the other housing part. The housing parts can also be secured in their position with respect to each other, at least temporarily, by auxiliary means. For example, the above-described adhesive agent or mechanical fits, stops or retaining means can be used. The adhesive agent is preferably applied only in a spotwise manner in the joining region of the housing parts. One of the housing parts can also be at least partially recessed in the other housing part. Care should be taken to ensure that a tight encapsulation of an internal volume does not take place by the securing of the position.

Subsequently, particles, in particular in a directed stream of particles, are sprayed onto the joining region. The joining region is thereby successively provided with a coating. During the spraying-on operation, the thickness of the coating preferably increases successively.

In one embodiment, a plurality of housings or structural members are thereby produced jointly. For example, by means of the method, a housing arrangement is produced in which there is at least one further housing part in addition to the first and second housing part. The housing arrangement can be separated later.

A plurality of aspects of an invention are described in the present disclosure. All of the properties which are disclosed with respect to the housing, the housing arrangement, the structural member, the structural member arrangement or the method are also correspondingly disclosed with respect to the respective other aspects, and vice-versa, even if the respective property is not explicitly mentioned in the context of the respective aspect.

The subjects described here are explained in more detail below with reference to schematic exemplary embodiments which are not true to scale.

BRIEF DESCRIPTION OF THE DRAWINGS

In the figures.

Preferably, in the figures below, the same reference signs refer to functionally or structurally corresponding parts of the various embodiments.

DETAILED DESCRIPTION OF ILLUSTRATIVE EMBODIMENTS

Figure 1:
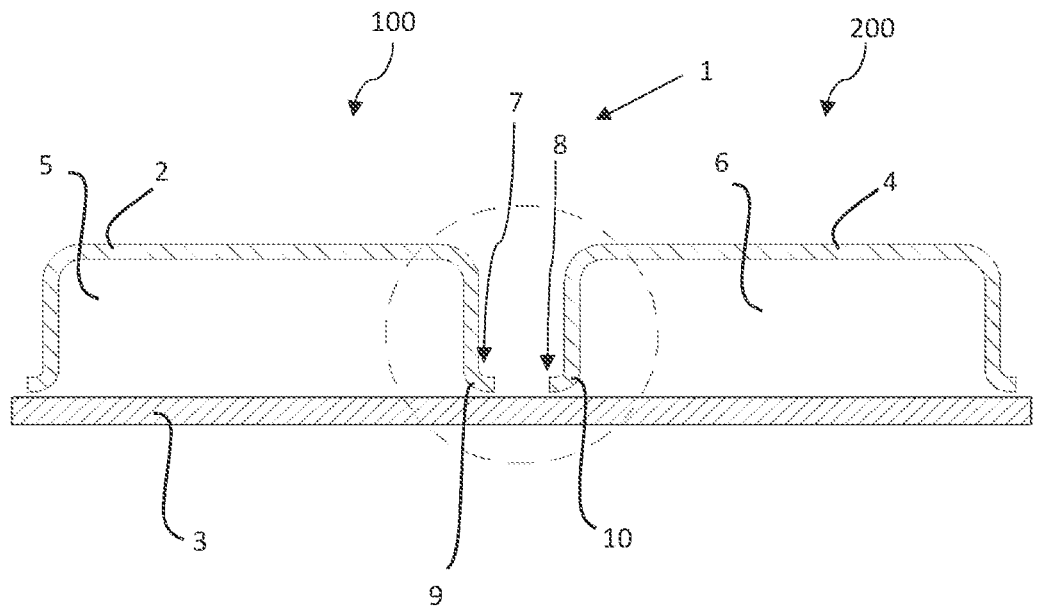
FIG. 1 shows a housing arrangement in a schematic cross section.

FIG. 1 shows a housing arrangement 1 comprising two housings 100, 200 for electric components. For example, the housings 100, 200 are designed for accommodating semiconductor chips, SAW chips, BAW chips, MEMS chips and/or passive components. Further details, such as, for example, internal redistribution wiring and external connections, are not depicted here. The housings 100, 200 are preferably processed jointly by a plurality of manufacturing steps and separated later. The description below of the design of the housing arrangement 1, in particular of the joining regions 7, 8 of the housings 100, 200, also applies analogously to separated housings. The structural and functional properties of the further housing 200 with the further housing part 4 can also be analogously present in the housing 100 with the first housing part 2, and vice-versa.

The housing 100 is formed by a first housing part 2 and a second housing part 3, the further housing 200 is formed by the further housing part 4 and the second housing part. Two cavities 5, 6 which are separate from each other and in which at least one structural member can be accommodated in each case, are formed.

The first and the further housing part 2, 4 are each designed as a cap. The second housing part 3 is formed by a substrate. In particular, it can be a multi-layered substrate.

The first and the further housing part 2, 4 are designed as caps. The housing parts 2, 4 have foot regions 9, 10 which rest on the second housing part 3. For example, the foot region 9 in top view has an annular or rectangular geometry.

The first housing part 2 is connected to the second housing part 3 in a joining region 7. A further joining region 8 is formed between the further housing part 4 and the second housing part 3. The further housing part 4 correspondingly has a further foot region 10. The joining regions 7, 8 encircle the first housing part 2 and the further housing part 4.

For example, the first housing part 2 contains a metal. Good electromagnetic shielding can therefore be obtained. Alternatively, the first housing part 2 can have, for example, a non-conductive material. In particular, a polymer material can be used. In this case, the shielding is preferably ensured in some other way.

The joining regions 7, 8 are preferably designed in such a manner that the cavities 5, 6 are sealed in an air-tight manner, preferably hermetically.

Various embodiments of joining regions 7, 8 are described in more detail below. That part of the housings 100, 200 which is located in the circle of dashed lines is in each case depicted in enlarged form. The embodiments are illustrated for the housing arrangement 1 comprising two joining regions 7, 8, but also apply correspondingly to a housing comprising one joining region.

Figure 2:
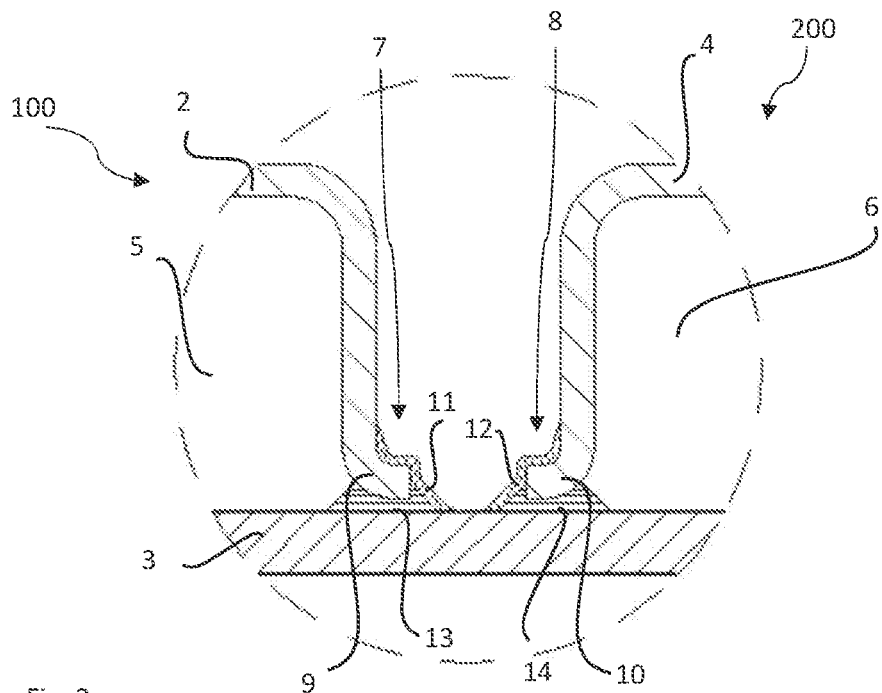
FIGS. 2 to 16 show various embodiments of joining regions of two housings in schematic cross sections.

FIG. 2 shows a schematic cross section of an embodiment of the joining regions 7, 8 of the housings 100, 200. The joining regions 9, 10 of the first and further housing parts 2, 4 are provided with a coating 11, 12. The coating 11, 12 extends in each case from the flank of the housing parts 2, 4 as far as the surface of the second housing part 3, i.e., as far as the substrate surface.

The first and further housing part 2, 4 are secured in each case at spots on the second housing part 3 by an adhesive agent 13, 14. The housing parts 2, 3, 4 are secured to one another by the adhesive agent, at least during the application of the coating 11, 12. The adhesive agent 13, 14 can be electrically conductive. For example, a solder or conductive adhesive is used as adhesive agent 13, 14.

The adhesive agent 13, 14 does not bring about hermetic sealing of the cavities 5, 6. For example, the adhesive agent 13, 14 does not fill the encircling joining region 7, 8 without a gap. For example, the adhesive agent 13, 14 is applied only in a spotwise manner. The hermetic sealing is achieved on the contrary by the respective coating 11, 12. The coating 11, 12 is partially also applied to the adhesive agent 13, 14.

The coating 11, 12 is applied by an application method in which particles are sprayed in a manner directed from the outside onto the arranged housing parts 2, 3, 4. Particles which are baked together to a greater or lesser extent can therefore still be identified in the coating 11, 12. The housing parts can be secured in their position with respect to one another prior to the application of the coating 11, 12. For example, the adhesive agent 13, 14 serves for this purpose. Owing to the spraying method, the coating 11, 12 is applied only to the upper side of the housing parts 2, 3, 4 and optionally of the adhesive agent 13, 14. The coating 11, 12 is located only at spots which are accessible from the outside during the spraying-on. In particular, there is no coating 13, 14 within the cavities 5, 6.

Figure 3:
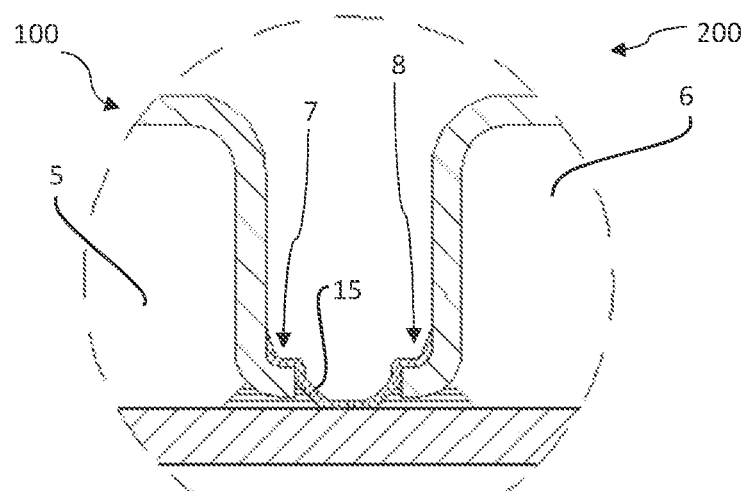

FIG. 3 shows a schematic cross section of a further embodiment of the joining regions 7, 8 of the housings 100, 200. In this case, there is a common coating 13 for the two joining regions 7, 8. This is of advantage in particular if the distances between the structural members arranged in the cavities 5, 6 or between the first and further housing parts 2, 4 are small. For example, the distances lie within the range of the spatial resolution of the application method or thereunder. Otherwise, the embodiment corresponds to the embodiment shown in FIG. 2.

Figure 4:
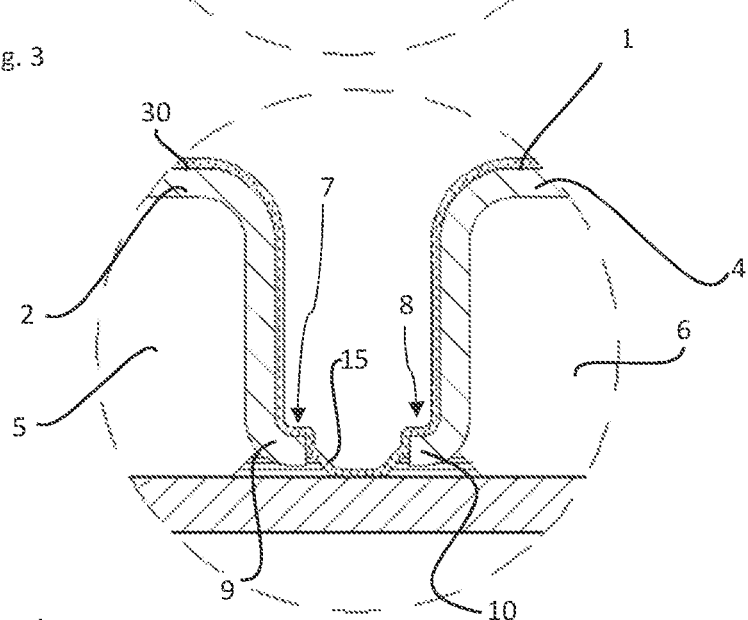

FIG. 4 shows a schematic cross section of a further embodiment of the joining regions 7, 8. Not only are the foot regions 9, 10 of the first and further housing part 2, 4 provided here with a coating 13, but so too are further regions which can no longer be assigned to the joining regions 7, 8. These are, for example, top and wall regions of the joining regions 7, 8. For example, the upper sides 14, 15 of the first and further housing part 2, 4 are completely covered with the coating 13.

For example, the material of the first and further housing part 2, 4 does not have sufficient tightness for the hermetic sealing of the cavities 5, 6. Sufficient tightness can be achieved by covering the full surface area with the coating 15. Alternatively or additionally thereto, electric shielding can be produced by the coating 15 over the full surface area. For example, the first and further housing part 2, 4 can contain a polymer material or can be composed of a polymer material. In order to achieve sufficient tightness and/or electric shielding, use can be made, for example, of a coating composed of a metallic material. The coating contains copper, for example. Also suitable are, for example, tin, zinc, aluminum, silver and mixtures and alloys thereof.

Figure 5:
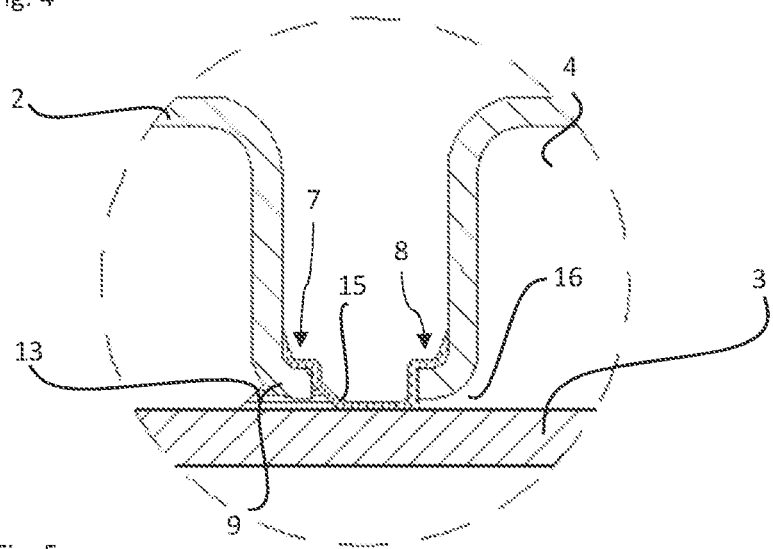

FIG. 5 shows a schematic cross section of a further embodiment of the joining regions 7, 8. The joining region 7 between the first housing part 2 and the second housing part 3 is designed as in FIG. 3. In particular, an adhesive agent 13 is located between the foot region 9 of the first housing part 2 and of the second housing part 3. The coating 15 also extends here over the two joining regions 7, 8.

The further joining region 10 does not have an adhesive agent in the depicted cross section. In particular, there is no adhesive agent at this spot between the housing part 4 and the second housing part 3. The pressure equalization in the further housing part 4 can thereby be ensured during the application of the coating 15. For example, the further housing part 4 is secured to the second housing part 3 at another spot of the joining region 8 by means of an adhesive agent.

For example, a gap 16 which is spanned by the coating 15 is located between the housing parts 3, 4. The gap 16 can occur, for example, when the housing parts 3, 4 are not fully co-planar. For example, the gap has a height of less than or equal to 50 µm. The lateral dimension of the structural members is, for example, 0.5 mm to 5 mm. The coating has, for example, a thickness of 10 µm to 100 µm. However, thicknesses of up to 500 µm may also be used in the event of particularly exacting requirements, for example, imposed on the mechanical robustness of the arrangement.

Also in the case of the first housing part 2, the adhesive agent 13 can be present only in regions. Alternatively, the adhesive agent 13 is present continuously in the first joining region 7. In particular, the adhesive agent 13 is located between the entire foot region 9 of the first housing part 2 and of the second housing part 3. In this case, the adhesive agent 13 is preferably selected in such a manner that it permits pressure equalization on account of its material properties and/or its thickness.

Figure 6:
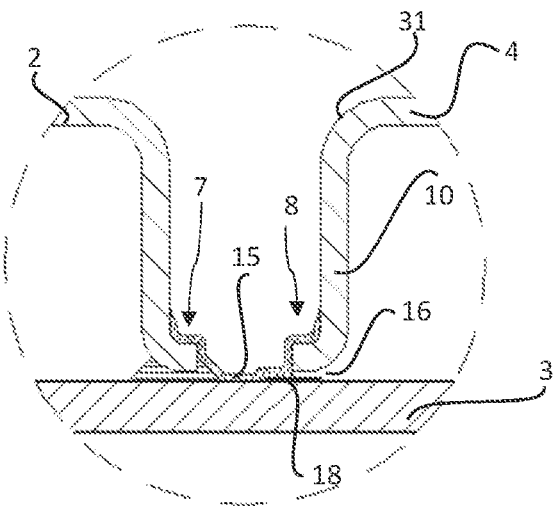

FIG. 6 shows a schematic cross section of a further embodiment of the joining regions 7, 8. The joining regions 7, 8 are designed substantially as described in FIG. 5. However, an electric contact 18 is provided on the second housing part 3. The electric contact 18 preferably serves for contacting the further housing part 4, in particular, the electric contact 18 is designed as a ground electrode. This can serve, for example, for the electromagnetic shielding. The first housing part 2 can likewise be connected to an electric contact (not shown here).

The electric contact 18 is arranged between the foot region 10 of the further housing part 4 and the second housing part 3 and projects in top view beyond the contour of the further housing part 4. Therefore, when a conductive, in particular metallic, coating 15 is applied, the electric contact 18 can also be at least partially covered by the coating 15. In this manner, a conductive connection of the coating 15 to the contact 18 can be produced. A good conductive connection between the contact 18 and the second housing part 4 can therefore be produced by the coating. In particular, a conductive connection is also produced whenever there is no direct electrical contact connection between the second housing part 4 and the contact 18, for example, because of a gap 16.

The contact 18 for its part can be connected and joined internally (not illustrated here), for example, with the aid of the second housing part 3 which can be designed as a multi-layered substrate.

Instead of a coating 15 which only partially covers the upper side 31 of the further housing part 4, the coating 15, as shown in FIG. 4, can also cover the full surface area of the upper side 31 of the housing part 4. In this manner, shielding and a connection to ground can be produced simultaneously by the coating 15.

Figure 7:
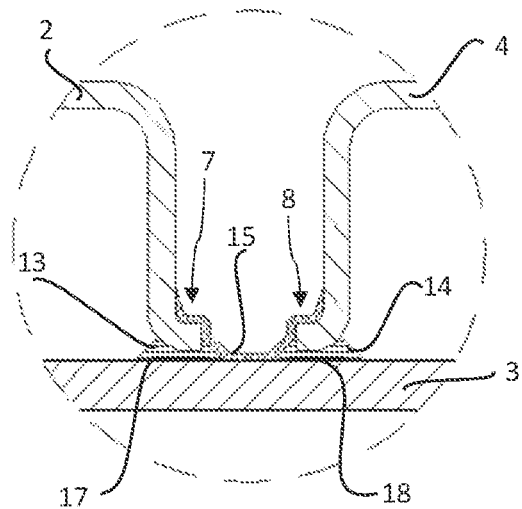

FIG. 7 shows a schematic cross section of a further embodiment of the joining region 7, 8. The first and the further housing part 2, 4 are each electrically connected to electric contacts 17, 18 for shielding purposes.

The electric contact is produced here via a respective adhesive agent 13, 14, and therefore the coating 15 is also only indirectly in electrical contact with the adhesive agent 13, 14. The adhesive agent 13, 14 is present at least in a punctiform manner and in each case fastens the first and further housing part 2, 4 to the second housing part 3 in the region of the electric contacts 17, 18.

Figure 8:
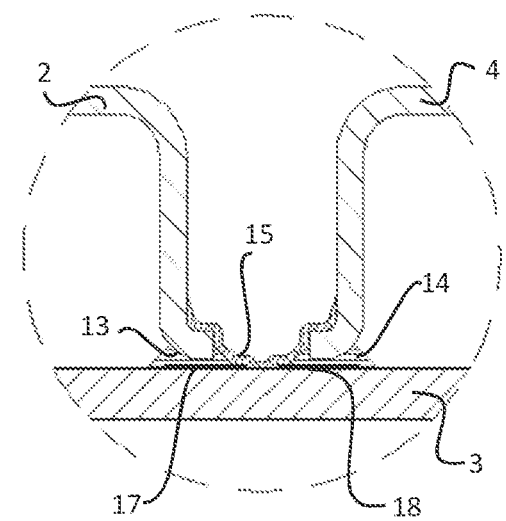

FIG. 8 shows a schematic cross section of a further embodiment of the joining regions 7, 8. The joining regions 7, 8 are designed substantially as described in FIG. 7.

However, in this embodiment, the electric contacts 17, 18 bind directly to the coating 15. The adhesive agent 13, 14 does not have to be conductive.

In particular, the electric contacts 17, 18 are exposed toward the coating, and therefore a direct connection is made possible. The exposition can be accomplished by an appropriately structured application of the adhesive agent 13, 14. Alternatively, an exposition can be accomplished by the electric contacts 17, 18 being at least partially uncovered from an adhesive agent 13, 14 applied thereabove. For example, the contacts 17, 18 are uncovered by cutting with a saw or laser ablation.

Figure 9:
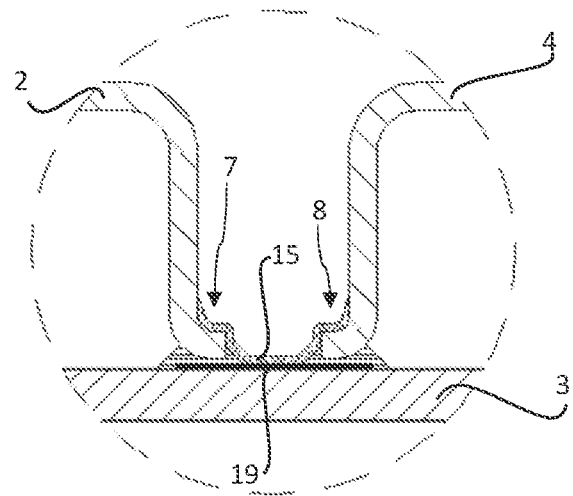

FIG. 9 shows a schematic cross section of a further embodiment of the joining regions 7, 8. The joining regions 7, 8 are designed substantially as described in FIG. 8. However, the first and further housing part 2, 4 are joined here to a common electric contact 19.

The arrangement shown is preferably separated later. The electric contact 19 is separated here in the center. The electric contact 19 is preferably joined internally to both sides.

Figure 10:
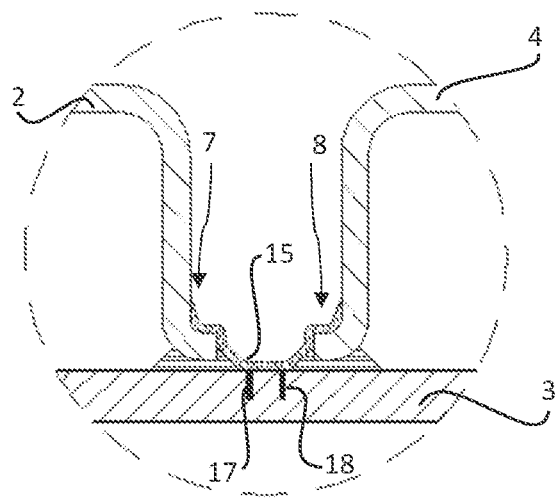

FIG. 10 shows a schematic cross section of a further embodiment of the joining regions 7, 8. The joining regions 7, 8 are designed substantially as described in FIG. 9. However, the electric contacts 17, 18 are not designed here as surface structural elements but rather as vias, i.e., as plated through-holes.

For example, the electric contacts 17, 18 are formed by a hole with a metallic filling or wall lining. A further internal connection (not illustrated) is also provided for this purpose.

Figure 11:
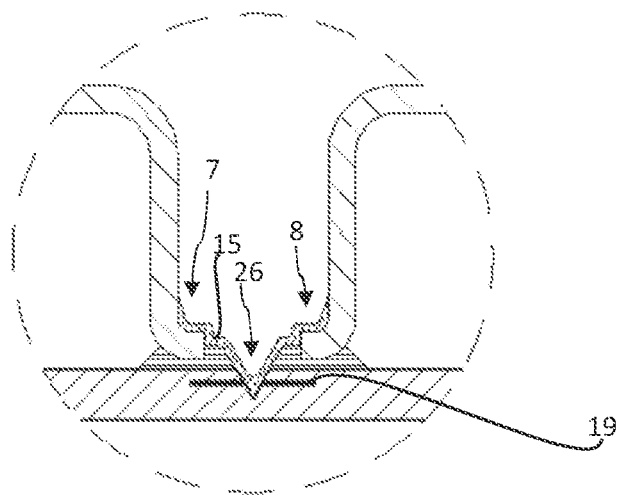

FIG. 11 shows a further embodiment of joining regions 7, 8. First of all an electric contact 19 is entirely formed here in the interior of the second housing part 3. The contact 19 is then at least partially exposed. This can be accomplished, for example, by a V-shaped or rounded saw cut. The coating 15 is subsequently deposited. The coating 15 therefore extends partially into the recess of the second housing part 2 and is therefore in direct electrical connection with the electric contact 19.

Figure 12:
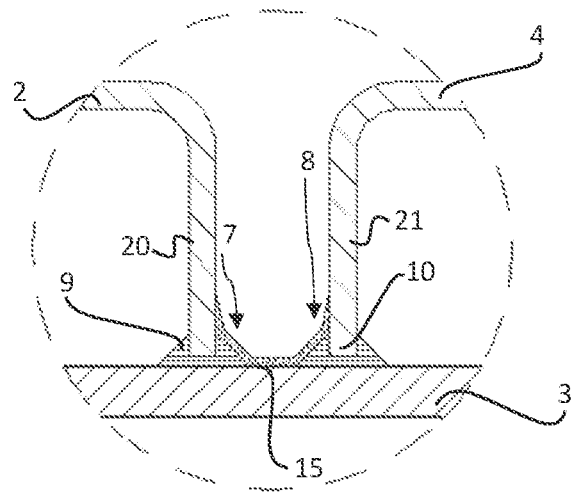

FIG. 12 shows a schematic cross section of a further embodiment of the joining regions 7, 8. The joining regions 7, 8 are designed substantially as described in FIG 3.

However, the foot regions 9, 10 of the first and further housing part 2, 4 are shaped differently here. In particular, the foot regions 9, 10 do not have a curvature, but rather the wall regions 20, 21 of the housing parts 2, 4 end rectilinearly. In particular, the foot regions 9, 10 are not designed in the manner of flanges.

The selection of a suitable profile of the housing parts 2, 4 is dependent in particular on the coating adhesion which is present and on the strength requirements.

Figure 13:
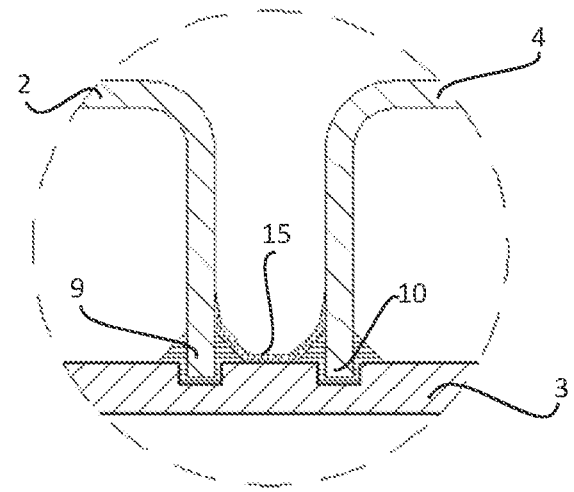

FIG. 13 shows a schematic cross section of a further embodiment of the joining regions 7, 8. The first and further housing part 2, 4 are in each case partially recessed here in the second housing part 3. In particular, the foot regions 9, 10 are recessed. This can be accomplished along the entire circumference of the housing parts 2, 4 or else only in parts thereof. The strength of securing the first and further housing part 2, 4 to the second housing part 3 can thereby be increased.

Figure 14:
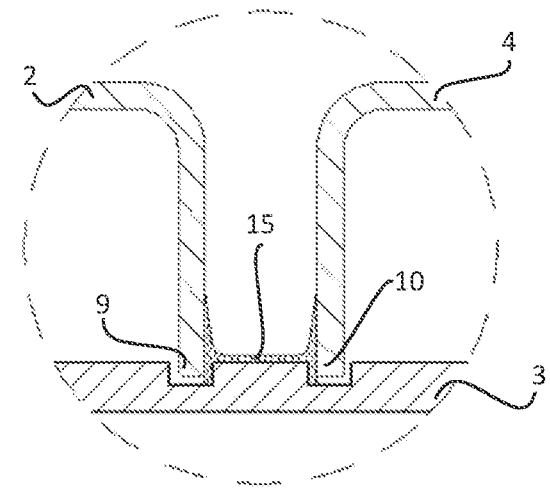

FIG. 14 shows a schematic cross section of a further embodiment of the joining regions 7, 8. In this embodiment, the recessing results in the first and further housing part 2, 4 being secured in position in a slip-proof manner on the second housing part 3, in particular in the mounting process. An additional adhesive agent is then not necessary for the securing. The coating 15 is directly applied to the housing parts.

Figure 15:
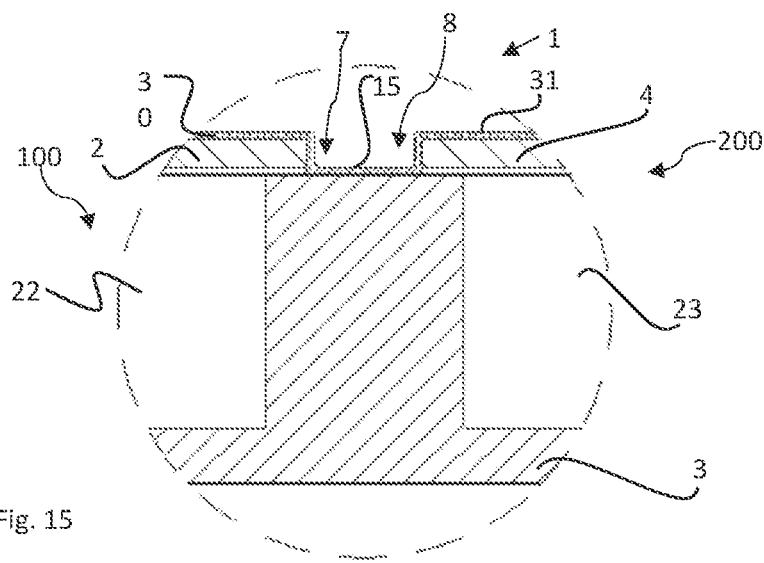

FIG. 15 shows a further embodiment of a housing arrangement 1 with two housings 100, 200, wherein the geometry of the housing parts 2, 3, 4 is selected differently than in the preceding embodiments.

The first and further housing part 2, 4 are in each case designed as flat covers. The second housing part 3 has recesses 22, 23 for accommodating the electric components. The second housing part 3 is formed by a substrate, in particular a trough-shaped substrate. The first and further housing part 2, 4 are provided with a common coating 15 which covers the upper sides 30, 31 of the housing parts 2, 4 completely. Also in the case of this housing concept, all variants of joining regions and coatings, as described for the preceding figures, can be selected.

Figure 16:
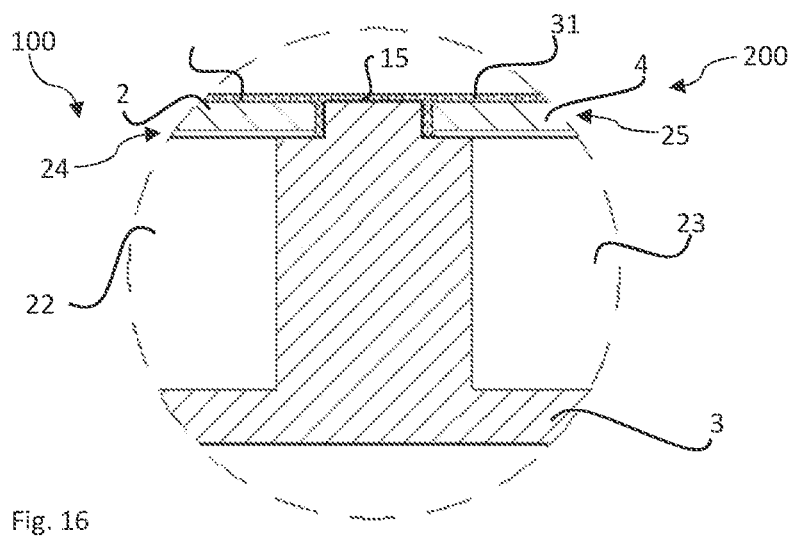

FIG. 16 shows a further embodiment of a housing arrangement 1 with two housings 100, 200, in which the first and further housing part 2, 4 are in each case designed as flat covers. The second housing part 3 is of trough-shape design and has additional recesses 24, 25 into which the first and further housing parts 2, 4 are inserted. The coating partially extends into the additional recesses 24, 25.

Figure 17:
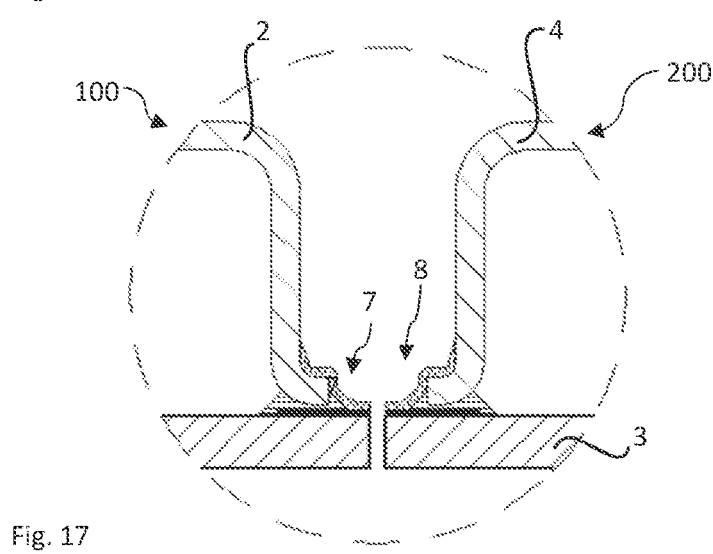
FIG. 17 shows the separating of a housing arrangement in a schematic cross section.

FIG. 17 shows two housings 100, 200 after the separation of a housing arrangement 1. The joining regions 7, 8 are designed here by way of example as illustrated in FIG. 9. The separating is accomplished, for example, by sawing, by abrasive cutting, by scoring and breaking, or by laser cutting.

Figure 18:
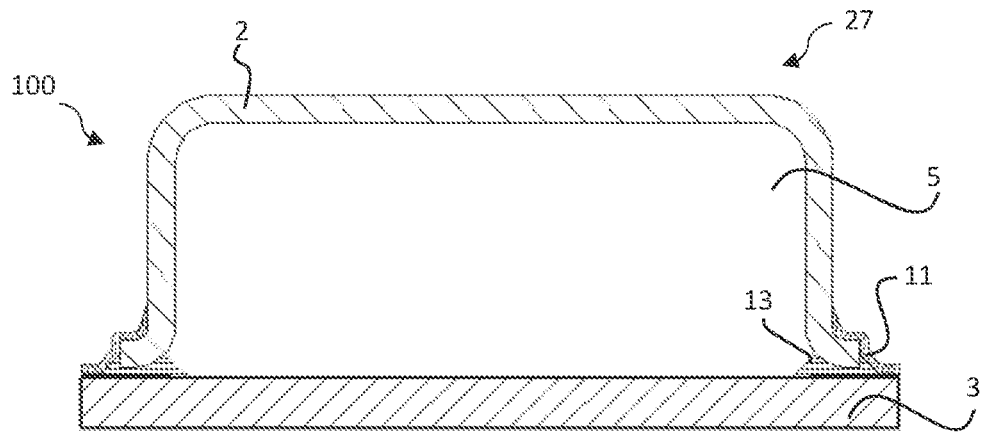
FIGS. 18 and 19 show various embodiments of a housing in a schematic cross section.

FIG. 18 shows a separated housing 100. A structural member 27 comprises the housing 100 with an electric component (not illustrated here) arranged in the cavity 5.

Figure 19:
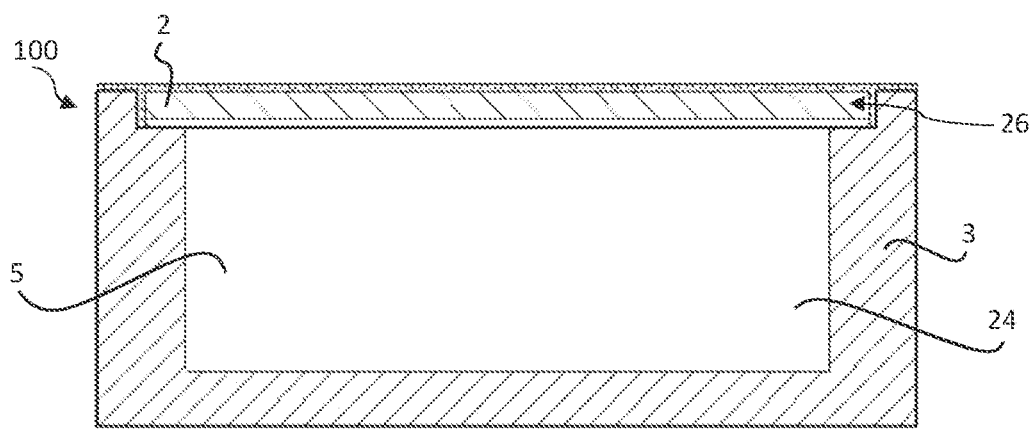

FIG. 19 shows a housing 100 in which the first and second housing part 2, 3 are designed as in FIG. 16. In particular, the first housing part 2 is designed as a flat cover which is inserted into a recess 26 of the second housing part 3. In addition, the second housing part 3 has a recess 24 for accommodating a component.

Figure 20:
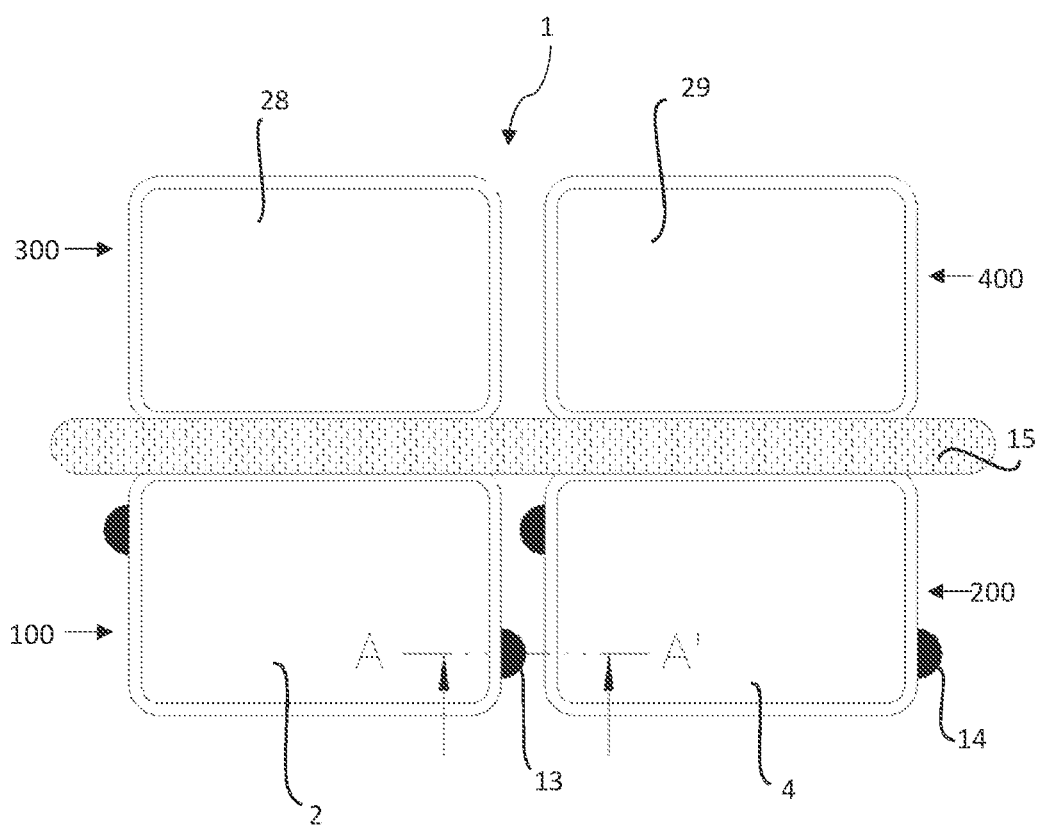
FIG. 20 shows a housing arrangement in a top view.

FIG. 20 shows a housing arrangement 1 comprising four housings 100, 200, 300, 400. Four housing parts 2, 4, 28, 29 are arranged on a common second housing part (not depicted), in particular a substrate. After the separation, four separate housings 100, 200, 300, 400 or structural members comprising electric components are accordingly present.

The two lower housing parts 2, 4 are secured on the second housing part in a punctiform manner by an adhesive agent 13, 14. The two upper housing parts 28, 29 are not secured by means of an adhesive agent. For example, the upper housing parts 28, 29 are placed only onto the second housing part, and are partially recessed therein or secured in some other way. Furthermore, a first strip of the coating 15 is shown. The cross sections depicted above are formed, for example, at the line denoted by A-A'.

The invention claimed is:

1. A method for producing a housing for an electric component, the method comprising:
   providing a first housing part and a second housing part;
   joining together the first and second housing parts in at least one joining region; and
   spraying particles onto the joining region under atmospheric conditions thereby forming a coating, wherein the joining of the first and second housing parts does not provide a hermetic joining of the first and second housing parts, and wherein gas exchange is initially enabled through the joining region when spraying the particles onto the joining region and is disabled as a layer thickness of the coating is increased.

2. The method according to claim 1,
   wherein an adhesive agent is located only at spots between the first housing part and the second housing part such that at least a region in a circumferential joining region between the first housing part and the second housing part is free from the adhesive agent and such that the adhesive agent does not form a contiguous circumferential path along the circumferential joining region.

3. The method according to claim 1, wherein the coating contains a metal.

4. The method according to claim 1, wherein the first housing part comprises an electrically insulating material.

5. The method according to claim 1, wherein an entire upper side of the first housing part is provided with the coating.

6. The method according to claim 1 wherein the housing includes at least one electric contact, and wherein the coating is in electrically conductive connection with the electric contact.

7. The method according to claim 6, wherein the coating electrically connects the electric contact to the first housing part.

8. The method according to claim 1, wherein an adhesive agent electrically connects the first housing part to an electric contact.

9. The method according to claim 1 wherein the first housing part at least partially extends within a recess in the second housing part.

10. The method according to claim 1,
wherein at least one electric component is accommodated in the housing.

11. The method according to claim 1, further comprising:
providing at least one further housing part;
joining the further housing part to the second housing part thereby forming a housing arrangement; and
separating the housing arrangement.

12. The method according to claim 1,
wherein the first housing part, apart from the coating, is secured in places to the second housing part only by a form-locking arrangement of the first and second housing parts.

13. A housing for an electric component comprising:
a first housing part; and
a second housing part,
wherein the first housing part is connected to the second housing part in a joining region,
wherein the joining region is covered by a coating containing sprayed-on particles,
wherein the coating provides a hermetic seal of the housing,
wherein the first housing part, apart from the coating, is secured in place to the second housing part by a form-locking arrangement of the first and second housing pails and/or by an adhesive agent, and
wherein neither the form-locking arrangement nor the adhesive agent provides a hermetic seal of the housing.

14. The housing according to claim 13, wherein the first housing part is formed from an electrically insulating material and comprises protrusions formed from the electrically insulating material, and wherein the protrusions extend into recesses of the second housing part, thereby forming a form-locking arrangement.

15. The housing according to claim 13, wherein the first housing part and the second housing part are not secured to each other by any form-locking arrangement but by and adhesive agent located only at spots between the first housing part and the second housing part.

16. A housing for an electric component comprising:
a first housing part; and
a second housing part,
wherein the first housing part is connected to the second housing part in a joining region,
wherein the joining region is covered by a coating containing sprayed-on particles,
wherein the coating provides a hermetic seal of the housing, and
wherein the first housing part, apart from the coating, is secured in place to the second housing part either by a form-locking arrangement of the first and second housing parts or by an adhesive agent located only at spots between the first housing part and the second housing part, but not by both a form-locking arrangement and an adhesive agent.

* * * * *

UNITED STATES PATENT AND TRADEMARK OFFICE
CERTIFICATE OF CORRECTION

PATENT NO. : 10,542,630 B2
APPLICATION NO. : 15/322089
DATED : January 21, 2020
INVENTOR(S) : Wolfgang Pahl Page 1 of 1

It is certified that error appears in the above-identified patent and that said Letters Patent is hereby corrected as shown below:

In the Claims

In Column 12, Line 8, Claim 13, delete "pails" and insert --parts--.

Signed and Sealed this
Twenty-first Day of July, 2020

Andrei Iancu
*Director of the United States Patent and Trademark Office*